United States Patent
Laletin (10) Patent No.: US 7,078,965 B2
(45) Date of Patent: Jul. 18, 2006

(54) SERVO BALANCING AMONG DRIVER DEVICES

(75) Inventor: William H. Laletin, Slidell, LA (US)

(73) Assignee: World Energy Labs (2), Inc., San Francisco, CA (US)

( * ) Notice: Subject to any disclaimer, the term of this patent is extended or adjusted under 35 U.S.C. 154(b) by 12 days.

(21) Appl. No.: 10/831,885

(22) Filed: Apr. 26, 2004

(65) Prior Publication Data

US 2005/0237109 A1    Oct. 27, 2005

(51) Int. Cl.
*H03F 1/36* (2006.01)

(52) U.S. Cl. .................. 330/48; 330/85; 330/124 R (58) Field of Classification Search ............... 330/265, 330/270, 271, 69, 124 R, 295, 84, 85
See application file for complete search history.

(56) References Cited

U.S. PATENT DOCUMENTS

| | | | |
|---|---|---|---|
| 4,035,718 A | 7/1977 | Chandler | 324/303 |
| 4,074,204 A | 2/1978 | Broburg et al. | 330/109 |
| 4,112,343 A | 9/1978 | Douglas | 318/674 |
| 4,491,802 A | 1/1985 | Uchida et al. | 330/260 |
| 4,540,951 A | 9/1985 | Ozawa et al. | 330/267 |
| 6,052,027 A | 4/2000 | Candy | 330/260 |
| 6,141,169 A | 10/2000 | Pietruszynski et al. | 360/67 |
| 6,160,455 A | 12/2000 | French et al. | 330/297 |
| 6,262,619 B1 | 7/2001 | McGreer et al. | 327/307 |
| 6,262,627 B1 | 7/2001 | Ghiozzi et al. | 330/51 |
| 6,291,962 B1 | 9/2001 | Ogura et al. | 318/609 |
| 6,445,195 B1 | 9/2002 | Ward | 324/684 |
| 6,465,993 B1 | 10/2002 | Clarkin et al. | 323/272 |
| 6,590,447 B1 | 7/2003 | Willis | 330/84 |
| 6,621,279 B1 | 9/2003 | Ward | 324/684 |
| 6,636,107 B1 | 10/2003 | Pelly | 327/552 |
| 6,646,508 B1 * | 11/2003 | Barbetta | 330/264 |
| 6,674,294 B1 | 1/2004 | Ward | 324/684 |
| RE38,454 E | 3/2004 | Walters et al. | 323/272 |
| 6,700,453 B1 | 3/2004 | Heiskala et al. | 332/103 |
| 6,700,522 B1 * | 3/2004 | Ivanov et al. | 341/155 |
| 6,713,462 B1 | 3/2004 | Metcalf, III et al. | 514/82 |
| 6,717,461 B1 | 4/2004 | Krishnapura et al. | 327/552 |

* cited by examiner

*Primary Examiner*—John B Nguyen
(74) *Attorney, Agent, or Firm*—Mark S. Leonardo; Joseph P. Quinn; Brown Rudnick Berlack Israels LLP (57) ABSTRACT

A method and apparatus for reducing imbalances among the outputs of a plurality of driver devices connected in a parallel configuration to drive a common load. One driver is designated as the master, and suitable servo circuitry is provided to each of the other slave drivers, each servo being operative to force the output of its associated slave driver to accurately track the output of the designated master driver. The servo circuitry may be disposed to equalize either the output voltages or output currents of the several drivers to ensure load balancing among the drivers, to reduce cross-conduction currents and attendant power wastage and improve dynamic performance. The plurality of drivers may either operate in an open-loop configuration, or be enclosed within an overall negative feedback loop under the control of a separate controller that itself may be an amplifier.

21 Claims, 8 Drawing Sheets

SERVO BALANCING AMONG DRIVER DEVICES

FIELD OF THE INVENTION

The present invention relates to amplifiers, and in particular, to a servo control method that ensures output balancing among amplifiers to both improve dynamic performance as well as increase efficiency by reducing cross-conduction losses, when a plurality of amplifiers are connected in a parallel arrangement to drive a common load.

BACKGROUND OF THE INVENTION

Whenever load currents in excess of a few milliamps are required to drive a load, two design approaches are available: either a single driver element may be used that is adequate to provide the required power, or several smaller driver elements may be deployed in a parallel arrangement such that each provides a substantially equal share of the drive power. As is known in the art, even nominally identical active devices will exhibit slightly different characteristics, so a means of ensuring accurate load balancing is almost always required whenever overall efficiency of a parallel array of active drivers is of concern, otherwise each of the drivers must be over-designed to accommodate the worst-case load current imbalance that might arise.

Load balancing may be achieved either by ensuring that each driver device is very closely matched to every other, or by providing an adjustment means to calibrate the transfer function of each individual driver, or even some combination of both methods. Except in well-controlled monolithic implementations, it is often difficult to ensure, except perhaps through very careful test and selection procedures, that a group of nominally identical drivers do actually behave in a substantially identical manner over time and temperature. So as a practical matter, it is usually preferred to provide an auxiliary adjustment means: manual or "set-once" trims may be implemented. However, to ensure that the adjustment remains correct over time, feedback schemes are often preferred to dynamically establish the correct operating points for each driver element.

While driver elements that provide current-mode outputs may be connected in parallel without serious adverse effects, as shown for example in U.S. Pat. No. 6,344,774 B2 to Ghiozzi et al., it is generally not advisable to directly interconnect the outputs of voltage-mode driver elements. In the latter case, even small differences in the individual output voltages will give rise to undesirable cross-conduction currents between the drivers, and, if the impedance of the interconnection between any pair of voltage-mode drivers is too small, voltage differentials as small as a few millivolts can lead to catastrophic results. To mitigate this potential problem, ballast resistors are conventionally placed in series with the output of each voltage-mode driver element to limit the maximum cross-conduction currents. While this scheme will reduce the possibility of driver destruction, the efficiency of the design will be commensurately reduced since power will be wasted in the ballast resistors in direction proportion to the load current demands.

In general, small low power devices exhibit many superior performance characteristics in comparison to larger, higher power types. Therefore, when very wide bandwidth, low noise, low offset or low thermal drift performance is desired, it may be preferable to connect a plurality of small driver elements in parallel array to drive a common load.

Despite that fact that more components are required for the parallel array implementation, it is often the case that the overall costs, physical space requirements and thermal dissipation problems may nevertheless be significantly reduced. In addition, a parallel architecture implicitly provides a degree of redundancy not present in a single-driver design.

Driver elements may be individual active devices such as bipolar transistors or FETs, monolithic devices such as amplifiers, or even entire active sub-circuits or modules.

When the drivers are discrete transistors, either bipolar or field-effect types, a modicum of load-balancing may be provided by simply placing a resistor in series with each emitter or source terminal, respectively. As is known in the art, current passing through this ballast resistor will develop a proportional voltage that serves as local negative feedback to the active device, mitigating both intrinsic and thermally related performance differences. In effect, the resistor serves to sense output current and provide feedback accordingly. When the drivers are active networks capable of both sourcing and sinking current, as for example linear amplifiers exhibiting very low output impedance, cross-conduction among the paralleled drivers may be likewise reduced by inserting a resistor in series with each driver.

When series ballast resistors are employed, their values should be selected to reduce current related errors to a safe level, and in general larger values provide better protection from current hogging and cross-conduction. Unfortunately, while the level of protection achieved increases as the value of these resistors is increased, the $I^2R$ power dissipated in these ballast resistors is wasted, so the designer is forced to trade off the degree of protection against the loss of efficiency.

In order to reduce the inefficiencies accompanying large-valued ballast resistors, several alternate schemes have been proposed, wherein the brute-force ballast resistor is replaced by or augmented with an active feedback network comprising both a sense resistor and at least one amplifying device that is configured to sense the voltage developed across the sense resistor by the load current and therefrom create a suitable feedback signal that is coupled to the driver to regulate its output.

When the driver element is a single bipolar transistor or an enhancement mode FET transistor (or an equivalent compound structure such as a Darlington), severe overload conditions may be prevented by placing a sensing resistor in series with the load current connected in a suitable configuration to a limiting transistor so that it turns on at a preset threshold and reduces the drive signal to the driver. While this method serves to protect drivers from severe overloading, it does not satisfactorily address the problems of cross-conduction or current-hogging when a plurality of drivers are operating in parallel to drive a common load. To mitigate these two problems, the feedback scheme must be capable of controlling and equalizing the outputs of the drivers continuously throughout the entire range of operation from quiescent conditions to full load operation.

An example of an active feedback scheme that addresses load sharing is disclosed in U.S. Pat. No. 4,035,715 to Wyman et al. for a power controller comprising a plurality of nominally similar driver modules. Two output current control schemes are presented: one teaches how the current of one module is sensed and used to control the total output of all the modules. By another, the output of each module is sensed individually and a composite feedback signal is developed to control the total load current. In this design, however, load-balancing among the drivers is only approximate, within ±10%, and is afforded by the known method of connecting series ballast resistors to the emitter terminal of each output transistor in each driver module, to provide local current feedback. Likewise, cross-conduction is limited only by the current-sensing series resistors themselves.

By employing high gain operational amplifiers to provide local negative feedback around a discrete output driver such as a bi-polar transistor or FET, accurate control may be achieved over the full operating range of the driver. An example of this method is provided in U.S. Pat. No. 6,646,508 to Barbetta, wherein a plurality of enhancement mode MOSFETs are disposed with their drain terminals connected together to serve as a push-pull output stage of a voltage-mode amplifier for audio applications. Each MOSFET is equipped with a source resistor coupled with an operational amplifier configured to both detect the voltage drop across the resistor as well as to provide gate drive to the MOSFET so that it behaves as a voltage controlled current source that output a current under the control of a separate driving signal. Because of the precise control effected for each individual driver, this method does prevent current-hogging among the driver elements, but it does not specifically address the issue of cross-conduction among device of like polarity.

When minimal cross-conduction errors and high quality dynamic performance are required but current-mode drivers are not a practical option, it is often preferable to employ a plurality of smaller, high quality voltage-mode drivers or amplifiers disposed in an efficient parallel configuration. Therefore, what is needed in the art is an efficient means to substantially eliminate cross-conduction errors among an array of voltage-mode drivers connected in a parallel array. Furthermore, what is needed in the art is a means to ensure very high quality dynamic performance in an array of voltage-mode drivers connected in a parallel array.

SUMMARY OF THE INVENTION

The present invention provides a method and system for reducing imbalances among the outputs of a plurality of driver devices, such as amplifiers, that are connected in a parallel configuration to cooperatively drive a common load. One driver is designated as the master, and suitable servo circuitry is provided to each of the other slave drivers, each servo being operative to force the output of its associated slave driver to accurately track the output of the designated master driver. The servo circuitry may be disposed to equalize either the output voltages or output currents of the several drivers, both to ensure load balancing among the drivers as well as to reduce cross-conduction currents and attendant power wastage. Dynamic performance of the array is also improved. The servo circuitry may be constituted to provide output tracking capability either over a very wide frequency range preferably greater than the effective closed-loop bandwidth of the drivers, or over only a limited frequency range that preferably includes DC. The plurality of drivers may either operate in an open-loop configuration, or be enclosed within an overall negative feedback loop under the control of a separate controller that itself may be an amplifier.

The present invention provides an apparatus and method for balancing the voltages exhibited at the outputs of each driver in an array of drivers connected in parallel to drive a common load, and thereby implicitly provide precise load-sharing when the drivers are only nominally identical. Such a parallel architecture can deliver exceptionally high performance in comparison to designs where a single driver is employed, since the dynamic characteristics of lower power drivers/amplifiers are often far superior to those of the higher-powered varieties.

In at least one embodiment, the invention comprises a parallel array of two linear amplifiers serving as drivers, each equipped with a low value resistor in series with its output node. These series resistors are then connected together at a common point that represents the output terminal of the parallel array of amplifiers. Each driver amplifier receives its local control signal from a global control signal means. Any imbalances among the amplifier outputs will be manifest as corresponding imbalances among the voltages appearing across the plurality of series resistors. A separate wide band differential amplifier, operative as a servo integrator, has one of its inputs connected to the output node of the first driver amplifier, designated the master, and its second input is connected to the output node of the second drive amplifier, designated as the slave. The output of the differential amplifier is connected to supply negative feedback operative to adjust the local control signal of the slave driver amplifier, such that its output voltage is forced to track the output voltage of the master over a very wide range of frequencies. According to the inventive method, the series resistors are not performing a ballasting function per se, but are instead serving as means to sense the output current of each driver. Therefore, these sensing resistors may assume much smaller values and physical sizes than would otherwise be required of dissipative ballast resistors found in a conventional design that does not employ active servo load balancing.

In an alternative embodiment, more than two driver amplifiers may be deployed within a parallel array controlled by a global control signal. As before, one amplifier is designated to be the master and the others are the slaves. Each amplifier is equipped with a small-valued sense resistor in series with its output, and every slave has an accompanying servo integrator amplifier connected such that the output voltage of each slave amplifier is forced to track the output of the master amplifier over a very wide range of frequencies.

In another embodiment, a plurality of driver amplifiers, each equipped with a small valued resistor in series with its output, are configured in a parallel array controlled by a global control signal. Each of the slave amplifiers is accompanied by a servo integrator amplifier that forces the slave amplifier's output voltage to track the output voltage of the designated master amplifier over a limited range of frequencies that includes DC.

In a further embodiment, a parallel array of driver amplifiers is equipped with means to force the output voltages of each slave drivers to track the output of the designated master driver amplifier, and the entire array is enclosed within a global feedback loop controlled by a main amplifier, which main amplifier creates a common controlling signal to control the parallel array of driver amplifiers.

In yet another embodiment, adjustment and calibration means are provided, to effect an improvement in the tracking accuracy of each servo amplifier associated with the slave amplifiers in a parallel array of amplifiers.

BRIEF DESCRIPTION OF THE DRAWINGS

The foregoing and other features and advantages of the present invention will be better understood from the following detailed description of illustrative embodiments, taken in conjunction with the accompanying drawings in which.

Whenever possible, elements that serve a similar function in each of the figures will be identified with the same reference designation.

DETAILED DESCRIPTION

Generally, the inventive method relates to circuit configurations wherein at least two driver elements are connected in a substantially parallel configuration, such that each driver element receives at least a portion of its input signal from a common controlling source that may be an amplifier. One of the driver elements is designated as the master, and all others in the parallel array are designated as slaves.

The output of each driver element is connected, through a small-valued sensing resistor, to a common point that represents the output node of the parallel array, from which node current can flow from each driver element through its associated sensing resistor into an external load. Each slave element has an associated servo amplifier connected to both the master and the slave in the known manner to force the voltage at the output of the slave to track the voltage at the output of the master. A variety of specific configurations may be employed to achieve the inventive method, several of which are described below in detail. Throughout the following specification, the terms "driver," "driver element" and "driver amplifier" will be used to designate circuit elements that provide power amplification, as distinguished from low power or small signal amplifier elements.

Figure 1:
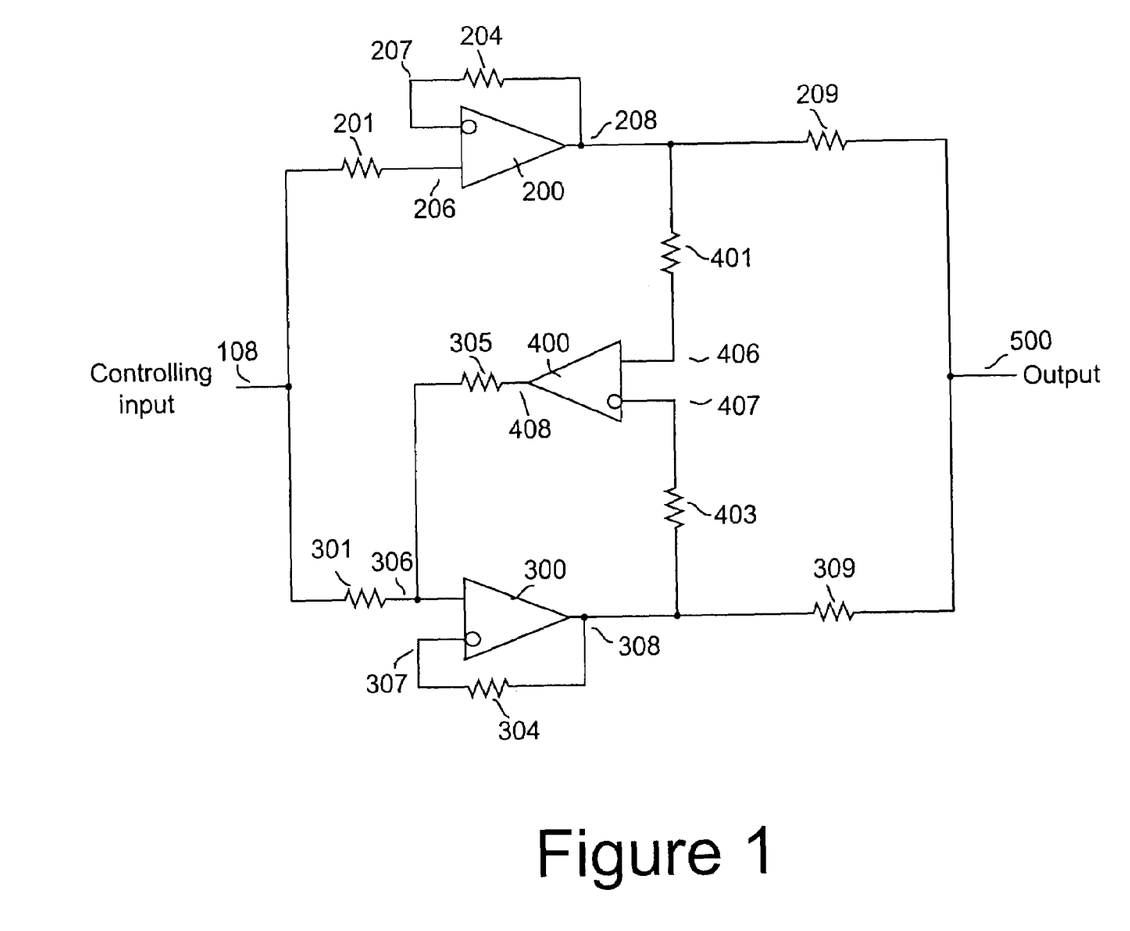
FIG. 1 is a schematic drawing of two parallel connected non-inverting amplifiers with an inverting servo according to an illustrative embodiment of the invention.

A first exemplary embodiment, depicted schematically in FIG. 1, comprises a parallel array of two differential amplifier 200 and 300, representing the master and slave drivers, respectively. A common input control signal is provided at node 108, preferably from a very low impedance source.

Amplifier 200 is operative as a unity gain buffer by virtue of the application of the controlling input to its non-inverting input 206, with feedback from its output 208 to its inverting input 207. Resistor 204 may be necessary in the local feedback path, between nodes 207 and 208, to ensure stability especially when amplifier 200 is a current-feedback type, however, if stability is not an issue, a direct connection may be used in place of resistor 204 to reduce noise. Similarly, it may be necessary in some cases to provide a small real impedance, shown as resistor 201, between common input node 108 and the non-inverting input 206 of amplifier 200 to improve stability, otherwise it may be replaced with a direct connection. Sense resistor 209 is connected between the output 208 of amplifier 200 and the common output node 500. The output current from amplifier 200 will flow through this resistor into a load connected at node 500, causing a voltage drop to be developed across sense resistor 209 proportional to the current.

Amplifier 300 is operative as a unity gain buffer by virtue of the application of the controlling input to its non-inverting input 306, with feedback from its output 308 to its inverting input 307. Resistor 304 may be necessary in the local feedback path to ensure stability especially when amplifier 300 is a current-feedback type, however, if stability is not an issue, a direct connection may be used in place of resistor 304 to reduce noise. Resistor 301 is interposed between common input node 108 and non-inverting input 306 of amplifier 300. A second input resistor 302 is also connected to node 306, to convey servo feedback as described below.

A separate differential servo means such as a differential amplifier 400 operates as a servo amplifier means, to force the output voltage of slave amplifier 300 to track the output voltage of master amplifier 200, in the following manner. The non-inverting input 406 of servo amplifier 400 is connected through optional resistor 401 to the output 208 of amplifier 200, while the inverting input 407 of amplifier 400 is connected through optional resistor 403 to output 306 of amplifier 300. Thence, output 408 of amplifier 400 is connected to resistor 302 to provide feedback to amplifier 300. To preserve loop stability and reduce overall noise, it is preferable for resistor 302 to be larger than resistor 301, typically by at least a factor of twenty. Since the common control input is driven by a low impedance source, and the output of amplifier 400 is also a low impedance source, resistors 301 and 302 form a simple voltage divider, with the non-inverting input of amplifier 300 connected at their junction. Any noise present at output 408 of amplifier 400 will be attenuated in proportion to the ratio of this divider network. In the known manner, negative feedback provided though resistor 302 by servo amplifier 400 causes the voltage appearing at output node 306 to track the voltage appearing at output node 206.

As long as the voltages at the output nodes of the driver amplifiers remain equal, no cross-conduction current will flow in the loop comprising sense resistors 209 and 309. In actual practice, however, the small but finite input offset voltage of amplifier 400 will appear across the series combination of resistors 209 and 309. Fortunately, amplifier 400 is not required to deliver any substantial amount of current, so a high quality type exhibiting very low offset may be easily selected. If extremely high precision is required, a conventional trim means may be used with amplifier 400. Note that, for applications where very high frequency performance is required, the sensing resistors should be low inductance types, to reduce unwanted phase shift.

To ensure the best performance, amplifier 400 should be selected to have an effective bandwidth substantially greater than the closed loop bandwidth of the particular driver amplifiers. In this case, the servo feedback will not only keep the low frequency offset errors to a minimum but any higher frequency disparities among the driver amplifiers will be substantially reduced. Thus, losses due to cross-conduction during very high frequency operation will be commensurately attenuated as well. This high-frequency servo capability can be especially important to maintain loop stability when wide bandwidth current-feedback amplifiers are employed in a parallel array.

The differential offset voltage appearing between output nodes 208 and 308 will typically be no larger than several millivolts, and can be made much smaller if a precision device is selected for amplifier 400. Therefore both sense resistors 209 and 309 can assume very small values, typically 50 milliohms or less: in a typical design, precision amplifier 400 may exhibit a maximum input offset voltage of 100 microvolts, yielding a worst case cross-conduction current of only 1 milliamp (i.e., 100 milliohms/100 microvolts). In contrast, higher powered ($I_{OUT}$>1 amp) driver amplifiers are often not equipped with offsetting means, and may exhibit unequalized offsets of tens or hundreds of millivolts. Since the power dissipated in the ballast/sense resistors is proportional to the square of the current, overall efficiency can be substantially improved by using the inventive servo offset balancing method. This can have considerable significance in low power and portable applications.

It will be clear to one skilled in the art that simple unity gain buffer amplifiers may be substituted directly for operational amplifiers 200 and 300, with the consequence that the local feedback resistors 204 and 304 will not be required. Likewise, it may be desirable to employ a plurality of servoed slave driver (SSD) sections to increase power output capability. This may be immediately achieved simply by replicating the circuitry comprising amplifiers 300 and 400 and the associated components. In general, the power output capability of such a parallel array may be increased by incorporating additional, substantially identical servoed slave driver sections as required.

Figure 2:
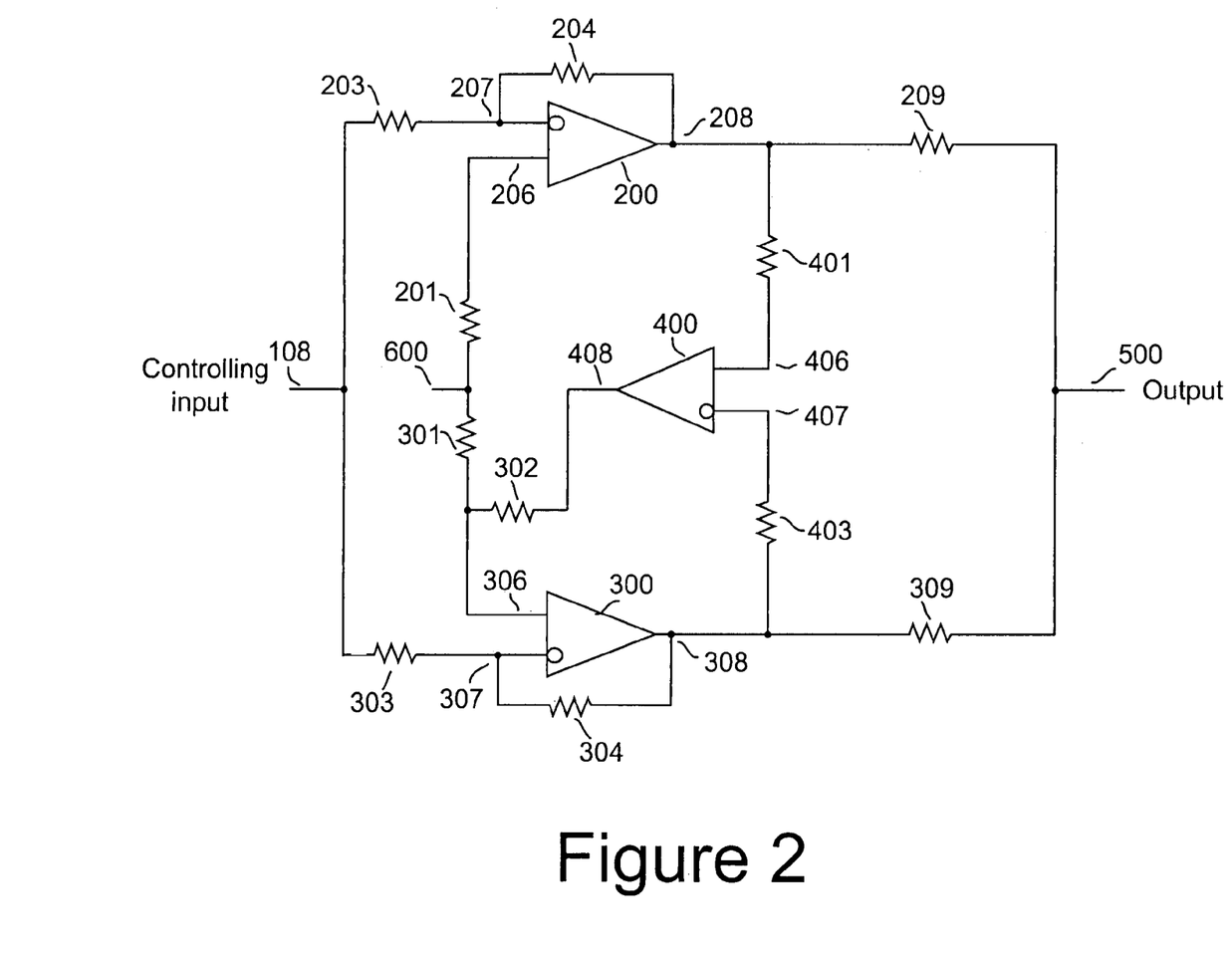
FIG. 2 is a schematic drawing of two parallel connected inverting amplifiers with an inverting servo according to an illustrative embodiment of the invention.

A second exemplary embodiment, depicted schematically in FIG. 2, comprises a parallel array of two differential amplifiers 200 and 300, representing the master and slave amplifiers, respectively. A common input control signal is provided at node 108, preferably from a very low impedance source.

Amplifier 200 is operative as a unity gain inverting amplifier by virtue of the connection of the input control signal 108 through resistor 203 to inverting input 207 and the feedback to input 207 through resistor 204 from output 208, provided that resistors 203 and 204 are substantially identical. Resistor 201 connected between non-inverting input 206 and ground 600 is optional, and may be included to ensure circuit stability. However, if stability is not an issue, a direct connection may be used in place of resistor 204 to reduce noise. Sense resistor 209 is connected between the output 208 of amplifier 200 and the common output node 500. The output current from amplifier 200 will flow through this resistor into a load connected at node 500, causing a voltage drop to be developed across resistor 209 proportional to the current.

Amplifier 300 is operative as a unity gain inverting amplifier by virtue of the connection of the input control signal 108 through resistor 303 to inverting input 307 and the feedback to input 307 through resistor 304 from output 308, provided that resistors 303 and 304 are substantially identical. Resistor 301 is interposed between ground 600 and non-inverting input 306 of amplifier 300 while a second input resistor 302 is also connected to node 306, to receive servo feedback as described below. Sense resistor 309 is connected between the output 308 of amplifier 300 and the common output node 500. The output current from amplifier 300 will flow through this resistor into a load connected at node 500, causing a voltage drop to be developed across sense resistor 309 proportional to the current.

Differential amplifier 400 operates as a servo integrator means, to force the output voltage of slave amplifier 300 to track the output voltage of master amplifier 200, in the following manner. The non-inverting input 406 of servo amplifier 400 is connected through optional resistor 401 to the output 208 of amplifier 200, while the inverting input 407 of amplifier 400 is connected through optional resistor 403 to output 306 of amplifier 300. Thence, output 408 of amplifier 400 is connected to resistor 302 to convey feedback to amplifier 300. To preserve loop stability and reduce overall noise, it is preferable for resistor 302 to be larger than resistor 301, typically by at least a factor of twenty. Since the common control input is driven by a low impedance source, and the output of amplifier 400 is also a low impedance source, resistors 301 and 302 form a simple voltage divider, with the non-inverting input of amplifier 300 connected at their junction. Any noise present at output 408 of amplifier 400 will be attenuated in proportion to the ratio of this divider network. In the known manner, negative feedback provided though resistor 305 by servo amplifier 400 causes the voltage appearing at output node 306 to track the voltage appearing at output node 206.

The same advantages listed in the first exemplary embodiment are conferred by this embodiment as well. In addition, the driver amplifiers may be configured to supply gains other than unity if desired, simply by adjusting the ratios within the pairs of gain setting resistors, 203 and 204, and 303 and 304, respectively. The gain of each servo slave section should match the gain of amplifier 200. Additional substantially identical servoed slave driver sections may be incorporated to increase the total power capability.

Figure 3:
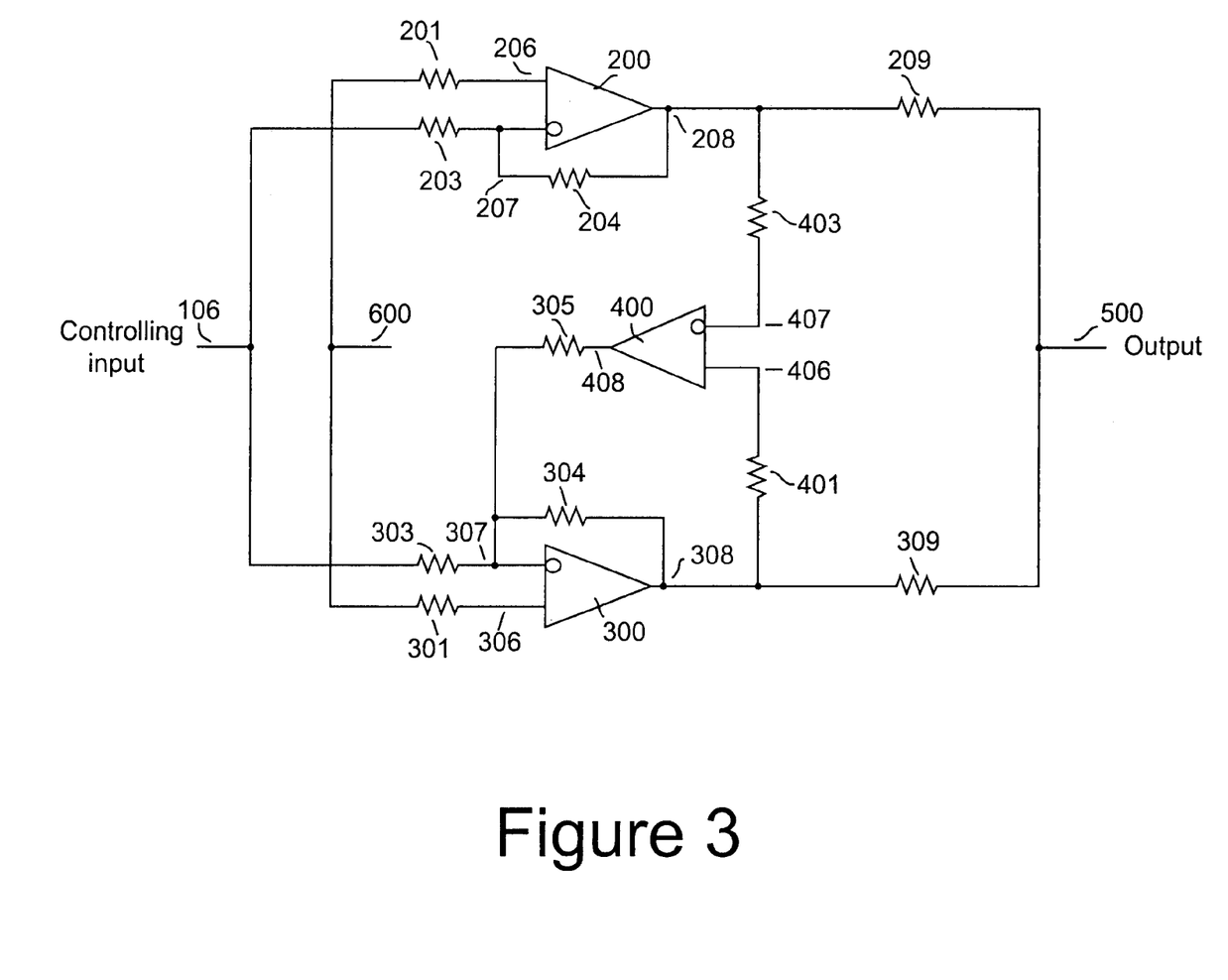
FIG. 3 is a schematic drawing of two parallel connected inverting amplifiers with a non-inverting servo according to an illustrative embodiment of the invention.

A third embodiment may be achieved by a slight alteration of the servo amplifier configuration disclosed above, whereby the servo feedback is applied to the inverting input of the associated slaved driver amplifier, as shown schematically for a pair of driver sections in FIG. 3. Note that when feedback is applied to the inverting input of the slave driver, the relative polarity of the servo amplifier's input connections must be reversed.

Amplifier 200 is operative as an inverting amplifier by virtue of the connection of the input control signal 108 through resistor 203 to inverting input 207 and the feedback to input 207 through resistor 204 from output 208. The gain of this section is determined in the conventional manner by the ratio of resistor 204 to resistor 203. Resistor 201 is optional, and may be included to ensure circuit stability. However, if stability is not an issue, a direct connection may be used in place of resistor 204 to reduce noise. Sense resistor 209 is connected between the output 208 of amplifier 200 and the common output node 500. The output current from amplifier 200 will flow through this resistor into a load connected at node 500, causing a voltage drop to be developed across resistor 209 proportional to the current.

Amplifier 300 is operative as an inverting amplifier by virtue of the connection of the input control signal 108 through resistor 303 to inverting input 307 and the feedback to input 307 through resistor 304 from output 308. The gain of this section is determined in the conventional manner by the ratio of resistor 304 to resistor 302, and preferably should match the gain of amplifier 200. An additional resistor 305 is also connected to node 307, to receive servo feedback as described below. Resistor 301 is interposed between ground 600 and non-inverting input 306 of amplifier 300, however this resistor may be omitted if not required to ensure stability. Sense resistor 309 is connected between the output 308 of amplifier 300 and the common output node 500. The output current from amplifier 300 will flow through this resistor into a load connected at node 500, causing a voltage drop to be developed across resistor 309 proportional to the current.

Differential amplifier 400 operates as a servo integrator means, to force the output voltage of slave amplifier 300 to track the output voltage of master amplifier 200, in the following manner. The non-inverting input 406 of servo amplifier 400 is connected through optional resistor 401 to the output 308 of amplifier 300, while the inverting input 407 of amplifier 400 is connected through optional resistor 403 to output 206 of amplifier 200. Thence, output 408 of amplifier 400 is connected to resistor 305 to convey feedback to amplifier 300. To preserve loop stability and reduce overall noise, it is preferable for resistor 305 to be larger than resistor 303, typically by about a factor of twenty. Any noise present at output 408 of amplifier 400 will be attenuated in proportion to the ratio of resistor 305 and resistor 304. In the known manner, negative feedback provided though resistor 305 by servo amplifier 400 causes the voltage appearing at output node 306 to track the voltage appearing at output node 206.

Because each of the driver amplifiers is operating in the inverting mode, with its non-inverting input connected to local ground, the common mode voltages appearing at the inputs of these amplifiers will be essentially zero. As is known in the art, the use of an inverting configuration often yields improved dynamic performance, and may be preferred for certain demanding applications. Additional substantially identical servoed slave driver sections may be incorporated to increase the total power capability.

A fourth embodiment employs differential amplifiers configured to serve as non-inverting driver amplifiers. Servo feedback is applied to the inverting input of each slave, while the control input signals is applied to the non-inverting inputs of every driver amplifier, as shown schematically in FIG. 4 for a pair of drivers. Here again, when servo feedback is applied to the inverting input of the slave amplifier, the relative polarity of the associated servo amplifier's input connections must be reversed.

Figure 4:
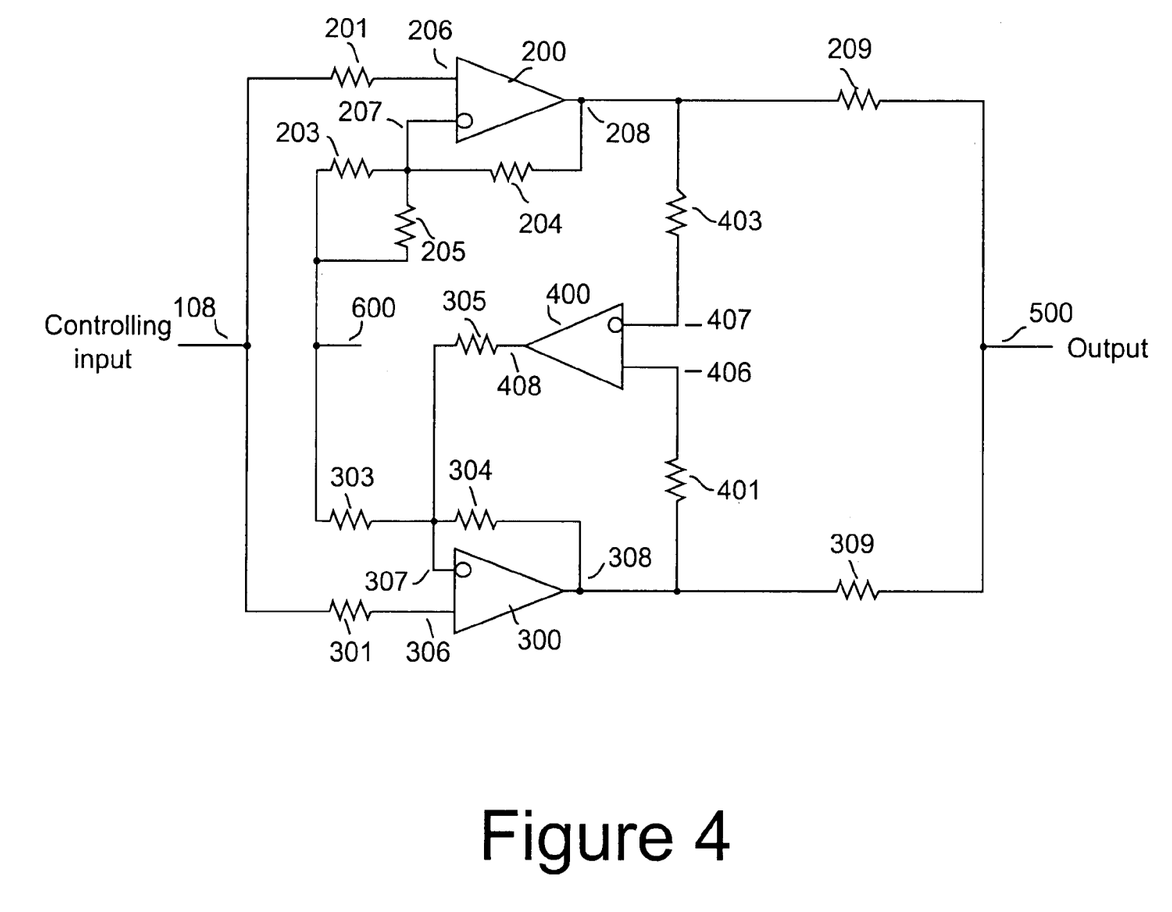
FIG. 4 is a schematic drawing of two parallel connected non-inverting amplifiers with a non-inverting servo according to an illustrative embodiment of the invention.

Amplifier 200 receives its controlling input from node 108, through resistor 201 connected to non-inverting input 206, and is operative as a non-inverting driver. Local feedback is conveyed from output 208 through resistor 204 to inverting node 207. Resistor 201 may be replaced with a direct connection if it is not needed to ensure stability. As is known in the art, the gain may be adjusted to a value greater than unity by adding a signal path between the inverting input and local ground. In this example, two resistors, 203 and 205, are shown connected in parallel, for reasons to be described subsequently, to provide this path between inverting input 207 and ground 600. Sense resistor 209 is connected between the output 208 of amplifier 200 and the common output node 500 such that the output current from amplifier 200 will flow through this resistor into a load connected at node 500, causing a voltage drop to be developed across resistor 209 proportional to the current.

Amplifier 300 is operative as a non-inverting amplifier by virtue of the connection of the input control signal 108 through resistor 301 directly to non-inverting input 306, but resistor 301 may be replaced with a direct connection if it is not required to ensure stability. Local negative feedback to inverting input 307 is conveyed through resistor 304 from output 308. The gain of this non-inverting driver will necessarily be greater than unity, due to the plurality of current paths connecting to its inverting input, at least one of which current paths, through resistor 305, is necessary to accomplish the intended servo balancing of the output voltage of amplifier 300. As in all parallel array designs, it is preferable that the closed loop gains of amplifiers 200 and 300 be substantially equal to ensure equitable current sharing. Sense resistor 309 is connected between the output 308 of amplifier 300 and the common output node 500 such that the output current from amplifier 300 will flow through this resistor into a load connected at node 500, causing a voltage drop to be developed across resistor 309 proportional to the current.

Because of the non-infinite impedance present by resistor 305 to inverting input 307, the closed loop gain of amplifier 300 will always be greater than unity. The values of resistors 303, 304 and 305 may be adjusted as needed to set the gain of amplifier 300. To preserve the balance among the amplifiers in the parallel array, resistors 203, 204 and 205 should be selected to have the same values as resistors 303, 304 and 305. Note that resistors 203 and 205 may be replaced with a single part having a value equal to the parallel combination of 203 and 205.

Differential amplifier 400 operates as a servo integrator means to force the output voltage of slave amplifier 300 to track the output voltage of master amplifier 200, in the following manner. The non-inverting input 406 of servo amplifier 400 is connected through optional resistor 401 to the output 308 of amplifier 300, while the inverting input 407 of amplifier 400 is connected through optional resistor 403 to output 206 of amplifier 200. Resistors 401 and 403 may be needed to ensure stability in some applications. Thence, output 408 of amplifier 400 is connected to resistor 305 to provide feedback to amplifier 300. To preserve loop stability and reduce overall noise, it is preferable for resistor 305 to be larger than resistor 304, typically by at least a factor of twenty. Any noise present at output 408 of amplifier 400 will be attenuated in proportion to the ratio of resistor 305 and resistor 304. In the known manner, negative feedback provided though resistor 305 by servo amplifier 400 causes the voltage appearing at output node 306 to track the voltage appearing at output node 206. Additional substantially identical servoed slave driver sections may be incorporated to increase the total power capability.

In the several embodiments described thus far, each servo integrator amplifier operates to force the output voltage of its associated slave amplifier to be substantially identical to the master amplifier's output over the entire range of frequencies that can appear at the output of the master amplifier, provided that each servo amplifier has a sufficient gain-bandwidth product to provide the required feedback signal over the desired bandwidth.

This very wide band servo technique will not only serve to substantially equalize any DC offsets of each slave amplifier, but it will also tend to equalize phase errors that may appear at the slave's output node. This latter effect can provide a significant improvement in efficiency when the parallel array is called upon to amplify very high frequency signals, since any phase errors among the outputs of the driver amplifiers will give rise to unwanted AC cross-conduction currents.

Figure 5:
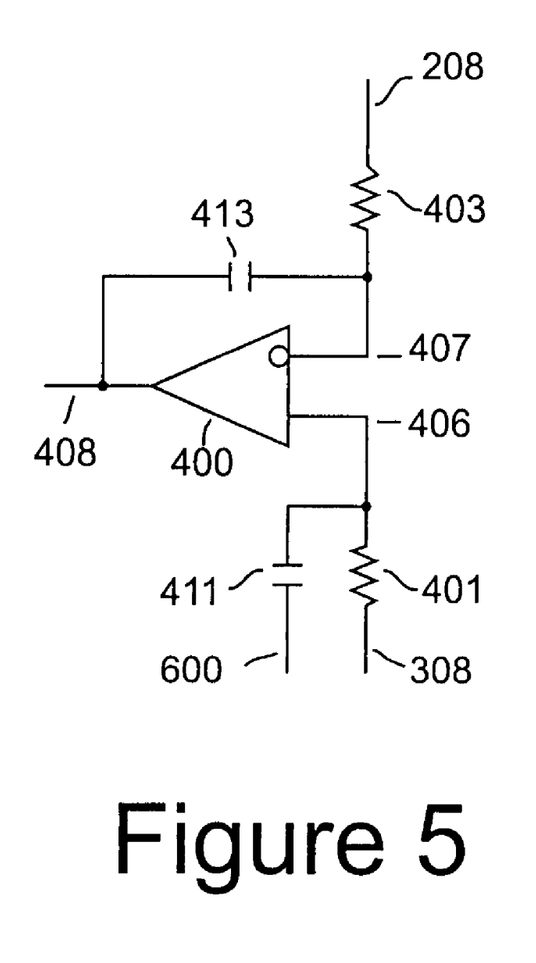
FIG. 5 is a schematic drawing of a servo amplifier with limited bandwidth according to an illustrative embodiment of the invention.

In an alternate embodiment, the bandwidth of the servo amplifier may be intentionally restricted to operate only over a limited frequency range. This method is useful and often preferred when phase equalization at very high frequencies is not required. A conventional example of a bandwidth limited servo amplifier is provided schematically in FIG. 5. Resistors 401 and 403 serve as the voltage sensing means for the output voltages of the master and slave amplifiers. The specific connections of 401 and 403 will depend on the configuration of the associated slave amplifier. Capacitor 411 operating in conjunction with resistor 401 provides low pass filtering, while capacitor operates with resistor 403 and amplifier 400 to yield a single pole integrator. It is preferred that the time constants of these two filter networks be very well matched, so that the entire circuit shown in FIG. 5 behaves as a differential integrator. The cutoff frequency can be adjusted to suit each particular application. Because only band limited signals will pass through the servo amplifier it may be selected specifically to have excellent DC and low frequency characteristics to improve the offset equalization achieved between the master and each of the slaves.

Each of the embodiments described thus far represents an open loop configuration comprising a parallel array of amplifiers, wherein a servo amplifier is connected to each slave amplifier to force its output voltage to track that of the sole master amplifier. While the inventive method provides a means to reduce any imbalances that would otherwise exist among the output voltages of the individual amplifiers, it does not provide any means to correct an overall offset that might obtain between the controlling input signal 108 and the final common output signal present at node 500. To provide a means to mitigate an overall offset, and to provide other valuable performance features, the entire array may be enclosed within the feedback loop of another amplifier, as shown schematically in FIG. 6.

Figure 6:
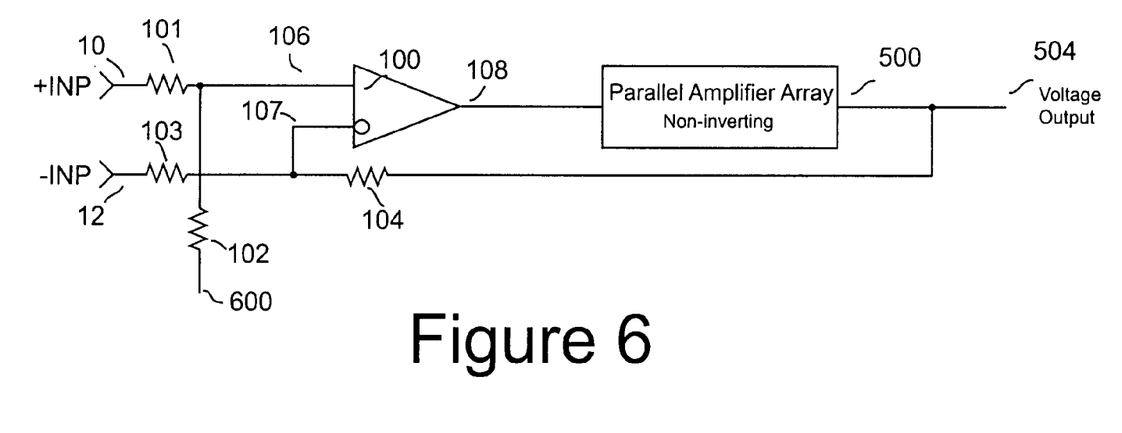
FIG. 6 is a schematic drawing of a compound voltage-mode amplifier with a non-inverting parallel array according to an illustrative embodiment of the invention.

Referring to FIG. 6, a block diagram is presented of a composite amplifier arrangement featuring a voltage-mode output, comprising a controlling differential amplifier 100 coupled to a non-inverting parallel amplifier array 150, and several associated components that provide negative feedback around the loop in the conventional manner. In operation, the output voltage at node 500 will remain proportional to the differential input voltage applied between input terminals 10 and 12, provided that the output signal is not required to exceed either its maximum current or voltage compliance capabilities. Specifically, the circuit features differential input means 10 and 12, representing the non-inverting and inverting inputs respectively. In many applications, one or the other of these inputs may be connected directly to a common ground or other fixed potential. Resistor 101 conveys an input signal from +INP 10 to non-inverting input 108 of amplifier 100, while resistor serves the same function between –INP 12 and inverting input 107 of amplifier 100. Output 108 is the controlling signal for parallel amplifier array 500, which is configured for a non-inverting transfer function. In the conventional manner, resistor 102 is connected between non-inverting input 106 and local ground 600, while resistor 104 completes the negative feedback connection between output 500 and inverting input 107. Note that resistor 102 may be connected to a potential other than ground to provide a fixed offset.

In cases where the parallel array operates with a voltage gain of unity, the amplitude of the signal provided at node 108 represents the entire voltage swing to be applied to any load connected at node 500. In other cases, the parallel array may be configured to supply a gain greater than unity, but care must be taken to adjust the input and feedback networks to preserve sufficient phase margin to avoid instability and oscillation. Alternately, the effective bandwidth of the entire circuit may be reduced by a combination of adding capacitors in parallel with elements 102 and 104 and optionally, adding capacitive feedback around amplifier 100, between its inverting input 107 and its output 108. Such overall bandwidth reduction may be desirable to decrease output noise and also to increase stability.

Figure 7:
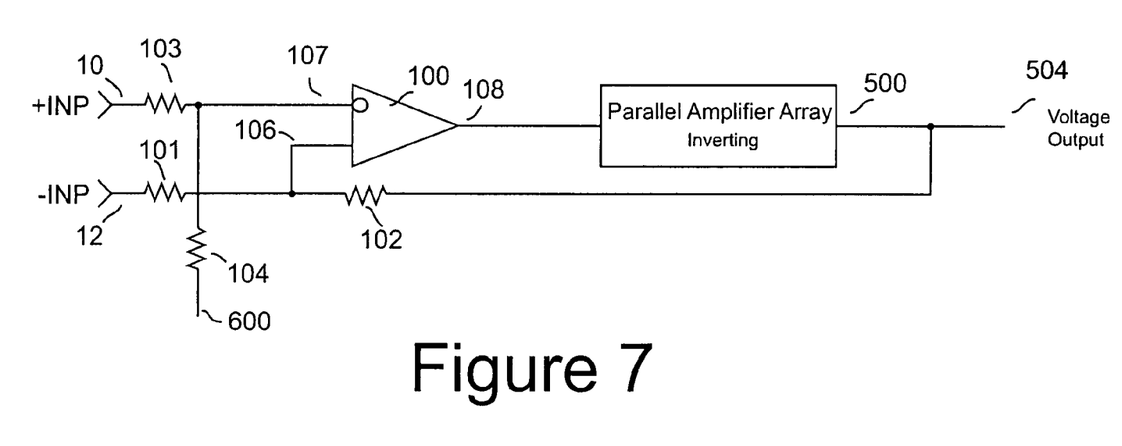
FIG. 7 is a schematic drawing of a compound voltage-mode amplifier with an inverting parallel array according to an illustrative embodiment of the invention.

Provided that amplifier 100 has a significant amount of open loop gain, the output offset voltage appearing at node 500 will be equal to the intrinsic input offset voltage of amplifier 500 multiplied by the closed loop gain of the overall circuit. In general, since amplifier 100 may be a relatively low power device, it can be chosen to have excellent performance characteristics such that the residual offset at node 500 will be considerably lower than the offset voltage exhibited by the parallel array of amplifiers alone. In addition, by virtue of the negative feedback connection around the loop, the level of distortion present in the output will be significantly reduced. This compound amplifier therefore will afford both good efficiency due to the servo balancing within the parallel array, and excellent dynamic performance due to both the controlling action of amplifier 100 as well as the intrinsically high performance obtained from the plurality of "smaller" amplifiers comprising the array Another voltage-output embodiment of a composite amplifier is shown in FIG. 7. Here, an inverting parallel array is employed. To allow the overall loop to operate properly, feedback is brought from output 500 through resistor 102 to amplifier 100 at its non-inverting input 108. Correspondingly, +INP 10 drives inverting input 107 through resistor 103, and –INP 12 supplies its signal through resistor 101 to non-inverting input 108. Resistor 104 is connected from inverting input 107 to local ground 600, or another fixed potential if desired. If desired, bandwidth and noise reduction can be achieved in the manner described previously.

Through the addition of a current sensing shunt in the output signal path and a slight modification of the feedback connections, each of the voltage-mode composite amplifier circuits described above may be transformed into transconductance amplifiers, featuring high performance current-mode outputs.

Figure 8:
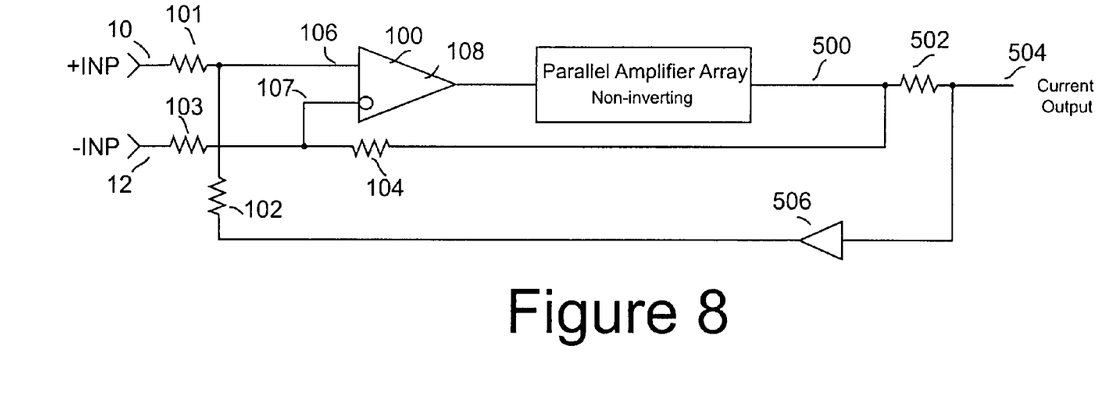
FIG. 8 is a schematic drawing of a compound transconductance amplifier with a non-inverting parallel array according to an illustrative embodiment of the invention.

A composite current mode amplifier comprising a control amplifier coupled to a non-inverting parallel amplifier array is depicted in FIG. 8. This corresponds to the current-mode analog of the design shown in FIG. 6. In this embodiment, a current shunt 502 is interposed between the array's output node 500 and the output terminal 504 of the composite amplifier. By employing both negative and positive feedback, a transconductance transfer function is obtained, whereby the output current delivered at node 504 is proportional to the differential voltage applied between inputs 10 and 12. Negative feedback through resistor 104 to inverting input 107 of main amplifier 100 is obtained from the proximal end of current shunt 502 at node 500, while positive feedback is conveyed to the non-inverting input 106 of amplifier 100 through resistor 102 and buffer amplifier 506, from the distal end of current shunt 502 at main output node 504. If very high accuracy is not required, buffer amplifier 506 may be omitted.

Figure 9:
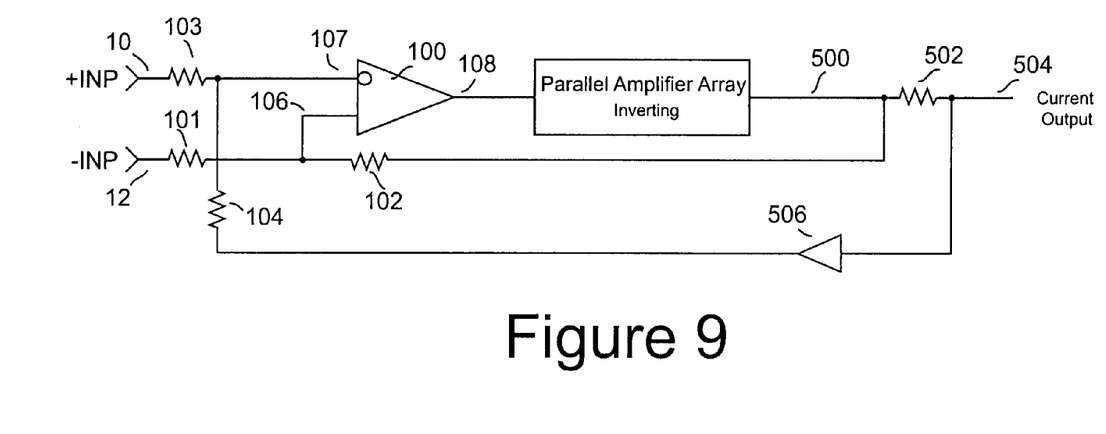
FIG. 9 is a schematic drawing of a compound transconductance amplifier with an inverting parallel array according to an illustrative embodiment of the invention.

Another transconductance version, similar in design to the voltage-mode version shown in FIG. 7, is shown in FIG. 9. Here again, current shunt 502 is inserted in the output signal path between node 500 and main output node 504. In this implementation an inverting parallel amplifier array is employed, requiring that the feedback connections at amplifier 100 be reversed. Negative feedback through resistor 102 to non-inverting input 106 of main amplifier 100 is obtained from the proximal end of current shunt 502 at node 500, while positive feedback is conveyed to inverting input 107 of amplifier 100 through resistor 104 and buffer amplifier 506, from the distal end of current shunt 502 at main output node 504. If very high accuracy is not required, buffer amplifier 506 may be omitted.

In both transconductance circuits, stability may be improved, and bandwidth and noise reduction may be accomplished, by adding capacitive elements to reduce overall bandwidth as described previously. Furthermore, each transconductance amplifier conveys the same efficiency and dynamic performance benefits as the composite voltage-mode amplifier, Once again, the overall output offset current is related only to the input offset voltage of amplifier 100, which, by a judicious choice for the controlling amplifier, can be made very small.

As known to those skilled in the art, it can be advantageous to arrange two amplifier sections having substantially equivalent power output capabilities in a bridge amplifier configuration so that a load may be connected between the outputs of the amplifier sections. When maximum efficiency is desired, the outputs of these amplifiers should be substantially equal in magnitude but opposite in phase. To achieve the same power output capability from a single amplifier connected to a grounded load, the output voltage compliance capability of this single amplifier must be doubled in comparison to that required of a pair of amplifiers deployed in a bridge arrangement, and consequently, the power supply voltage(s) for a single-ended design need to be approximately doubled as well.

In a conventional bridge mode arrangement, it is necessary that an accurate differential signal be applied across the load. This result may be achieved by one of several methods. According to a first method, one amplifier provides an inverting output while the other provides a non-inverting output, and each of the corresponding inputs of the two amplifiers are connected appropriately to the common input signal. By a second method, the amplifiers are connected in cascade, where the first amplifier, which may be either inverting or non-inverting, receives the controlling input while the second amplifier, necessarily configured to provide an inverting output, takes its input from the output of the first amplifier. By a third method, the two power amplifiers are substantially identical, are each equipped with differential inputs and a differential pair of driving signals is provided. By connecting the amplifiers' inputs so that the outputs appear out of phase, a bridge arrangement is achieved.

Figure 10:
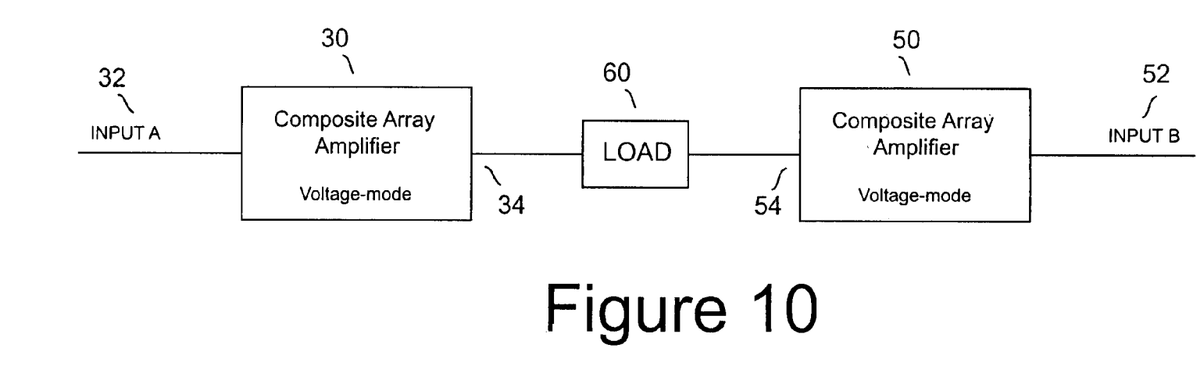
FIG. 10 is a schematic drawing of a voltage-voltage conventional bridge design according to an illustrative embodiment of the invention.

When the bridge amplifier comprises a pair of parallel array amplifiers having substantially identical voltage-mode output characteristics, the several performance advantages previously described for the inventive method may be immediately obtained. An exemplary embodiment comprising two voltage-mode amplifier sections is depicted in FIG. 10. Signal 32 and 52 constitute the controlling inputs. If amplifiers 30 and 50 provide outputs of the same relative polarity, then these input signals must be opposite in phase. Otherwise, if the amplifiers' transfer functions are of opposite relative polarity then inputs 30 and 50 may be identical. The load is connected in between the two amplifiers, at outputs 34 and 54, which constitutes a conventional voltage-mode bridge arrangement.

Figure 11:
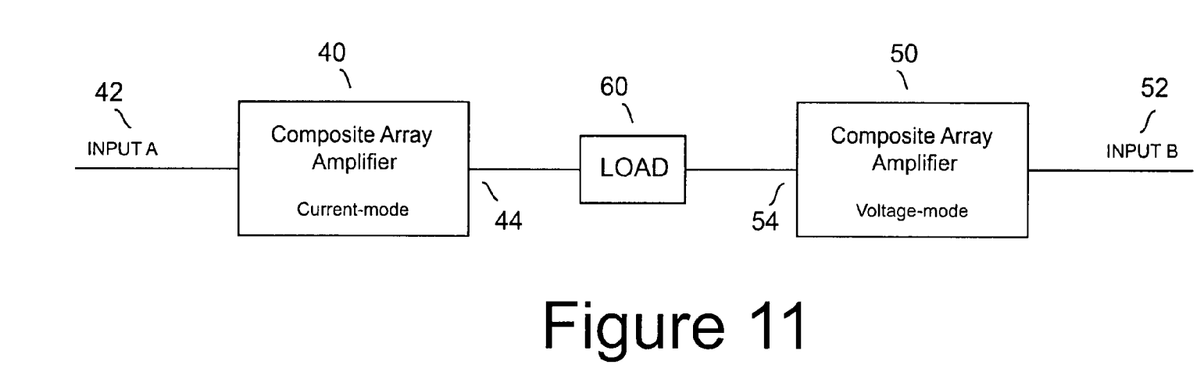
FIG. 11 is a schematic drawing of a current-voltage mixed mode bridge design according to an illustrative embodiment of the invention.

In an alternate embodiment, the bridge configuration comprises both a voltage-mode and a current-mode amplifier section. This mixed-mode arrangement is particularly well suited for precision metrology applications such as those disclosed in U.S. Pat. No. 6,411,098 to Laletin, which is hereby incorporated by reference herein in its entirety and US Published Application 20030206021 by Laletin which is also incorporated herein by reference in its entirety. A representative embodiment of a mixed-mode design is depicted in FIG. 11. Unlike the conventional voltage-mode bridge wherein the outputs delivered to the load are preferably fully differential, a mixed-mode design employs two entirely separate inputs so that the signals provided at the corresponding outputs will necessarily be dissimilar. For example, the current-mode amplifier may receive an AC controlling signal, while the voltage-mode amplifier may receive a substantially constant DC signal. Several performance advantages are conferred by the inventive mixed-mode bridge design.

In particular, as taught in the aforementioned US patent and published application, a mixed-mode bridge amplifier comprising both a current-mode and a voltage-mode section may be controlled in a manner such that a self-centering function is achieved. For example, when the load is an electrochemical cell or battery that exhibits an intrinsic bias voltage, the DC controlling signal provide at 52 can be adjusted such that the voltage of the biased load (e.g., the 'open-circuit' voltage of a charged cell or battery) appears centered with respect to the common ground potential of the overall mixed-mode bridge circuit. In other words, the DC potential appearing at node 44 will be equal in magnitude to, but opposite in polarity from, that voltage appearing at node 54. If the mixed-mode bridge amplifier is provided with symmetric bipolar power supplies, the common voltage will represent the common ground. Otherwise, the common potential will preferably correspond to the mid-point between the single power supply and local ground. In addition, an auto-polarity function can be achieved by proper adjustment of the DC input signal, as described in the cited disclosures.

The self-centering feature allows an immediate reduction in the magnitude of the requisite power supplies, which makes it particularly well suited for portable instrumentation applications wherein either weight, physical size or battery-pack longevity is of concern. An auto-polarity feature may also be eliminated, as described in the aforementioned art, that eliminates the need for complex switching circuitry in the load signal path that would otherwise be required when connection to biased loads is contemplated.

A block diagram of the mixed-mode design is provided in FIG. 11. Composite amplifier 40 may correspond to any of the current-mode designs described previously and depicted in FIGS. 8 and 9, while composite amplifier 50 may correspond to any of the voltage-mode designs described previously and depicted in FIGS. 6 and 7. Composite amplifier 430 is provided at node 42 with controlling signal 32 Input A, while composite amplifier 50 is provided at node 52 with controlling signal 52 Input B, which controlling signals need not be similar.

The output 44 of composite amplifier 40 preferably exhibits a very high impedance, such that the output appears as a current-mode signal. Therefore, the voltage appearing at node 42 will adjust itself accordingly (by virtue of the negative feedback employed within the composite amplifier block) to deliver a known current controlled by input 42, irrespective of the impedance characteristics or intrinsic bias voltage presented by load 60, provided of course, that neither the output voltage compliance nor the output current compliance limits are exceeded.

The output 54 of composite amplifier 50 preferably exhibits a very low impedance, such that the output appears as a voltage-mode signal. Therefore, the voltage appearing at node 54 will (by virtue of the negative feedback employed within the composite amplifier block) will be proportional to the controlling signal at input 52, irrespective of the impedance characteristics or intrinsic bias voltage presented by load 60, provided of course, that neither the output voltage compliance nor the output current compliance limits are exceeded. Since the load is connected between a voltage source and a current source, the potential exhibited at node 54, being provided by a low impedance voltage source, will directly influence the potential appearing at high impedance node 44. More specifically, any additional potential drop that arises due to current flowing through the impedance of load 60 will algebraically add to the potential present at node 54, to yield the actual potential appearing at node 44.

To ensure even greater accuracy in the voltage equalization provided by each servo amplifier within an array of amplifiers, it may be desirable to incorporate individual adjustment means for each servo amplifier, whereby its residual input offset error may be trimmed to a very small value. Many high precision operational amplifiers suitable for use in this application are equipped with offset correction pins, to which an analog or digital trim potentiometer may be connected, allowing the residual offset to be significantly reduced. If the application does not require that the servo operate over a very wide bandwidth, any of a variety of commercial auto-zeroing amplifier types may be employed with excellent results.

What is claimed is:

1. A parallel array of driver elements having a common input node and a common main output node, said array comprising:
   a master driver means capable of providing an output signal conveyed through a sensing means to a main output node, which master amplifier is disposed to receive a controlling signal from a common input node; and
   at least one slave driver means capable of providing an output signal conveyed through a sensing means to said main output node, which slave driver means is disposed to receive a controlling signal from said common input node; and
   a separate differential servo means associated with each said slave driver means, which servo means is configured to differentially sense the output voltages of said master driver and of said associated slave driver, which said servo means being disposed to convey negative feedback to said associated slave driver operative thereby forcing the slave driver's output voltage to substantially track the master output voltage.

2. The apparatus of claim 1, wherein the master driver means is a differential operational amplifier, disposed in one of several configurations including:
   a non-inverting configuration wherein its non-inverting input terminal receives a controlling input signal, and local negative feedback is applied between its inverting input and its output, and its output signal is coupled to one input of a servo integrator amplifier;
   an inverting configuration wherein its inverting input terminal receives a controlling input signal, and local negative feedback is applied between its inverting input and its output, and its output signal is coupled to one input of a servo integrator amplifier.

3. The apparatus of claim 2, wherein the gain of the master driver amplifier is increased by interposing a non-zero impedance element between its inverting input and a separate fixed-potential node, which node may be at a common ground potential and said non-zero impedance element may comprise either a resistor or network of resistors exhibiting a real impedance, or an element or network of elements exhibiting an imaginary impedance, or an element or network of elements exhibiting a complex impedance.

4. The apparatus of claim 1, wherein each slave driver is a differential operational amplifier disposed, along with an accompanying servo amplifier in a non-inverting configuration wherein each slave driver amplifier receives a controlling signal at its non-inverting input terminal and local negative feedback is applied between the inverting input and the output of said slave drive amplifier, and said output signal is coupled to the inverting input of a servo integrator amplifier, the output of said servo amplifier being conveyed as negative feedback to the non-inverting input of said slave driver amplifier, while the non-inverting terminal of said servo amplifier is coupled to the output of said master driver amplifier.

5. The apparatus of claim 1 wherein each slave driver is a differential operational amplifier disposed along with an accompanying servo amplifier in an inverting configuration wherein each slave driver amplifier receives a controlling signal at its inverting input terminal and local negative feedback is applied between said inverting input and the output of said slave drive amplifier, and said output signal is conveyed to the inverting input of a servo integrator amplifier, the output of said servo amplifier being conveyed as negative feedback to the non-inverting input of said slave driver amplifier, while the non-inverting terminal of said servo amplifier is coupled to the output of said master driver amplifier.

6. The apparatus of claim 1 wherein each slave driver is a differential operational amplifier disposed along with an accompanying servo amplifier in an inverting configuration wherein each slave driver amplifier receives a controlling signal at its inverting input terminal and local negative feedback is applied between said inverting input and the output of said slave drive amplifier, and said output signal is conveyed to the non-inverting input of a servo integrator amplifier, the output of said servo amplifier being conveyed as negative feedback to the inverting input of said slave driver amplifier, while the inverting terminal of said servo amplifier is coupled to the output of said master driver amplifier.

7. The apparatus of claim 4, wherein the gain of each slave driver amplifier is increased by interposing a non-zero impedance element between its inverting input and a separate fixed potential node, which node may be at a common ground potential and said non-zero impedance element may comprise either a resistor or network of resistors exhibiting a real impedance, or an element or network of elements exhibiting an imaginary impedance, or an element or network of elements exhibiting a complex impedance.

8. The apparatus of claim 1, wherein the differential servo amplifier either:
   exhibits significant gain over a very wide bandwidth; or
   exhibits significant gain only over a limited bandwidth that includes DC, which bandwidth limitation is provided either by the intrinsic limitations of the amplifier, or by the use of capacitors and resistors to configure the amplifier as a differential integrator.

9. A composite amplifier comprising:
   a control amplifier, provided with differential inputs, disposed to deliver a controlling input signal for a parallel array of substantially identical drivers, one of which is the master driver while the others are slave drivers;
   for each slave driver, an associated differential servo amplifier, operative to force the output voltage of its associated slave driver to substantially track the output voltage of the master driver; and either one connection from the common output node of the plurality of driver amplifiers to one input of the control amplifier to provide voltage-mode feedback, such that the output voltage of the composite amplifier is controlled by the differential input signal conveyed to the control amplifier; or two connections from a common load current sensing means to the differential inputs of the control amplifier to provide current-mode feedback, such that the output current of the composite amplifier is controlled by the differential input signal conveyed to the control amplifier.

10. The composite amplifier of claim 9, wherein either:

the parallel array of drivers provides non-inverting gain, and the overall voltage-mode output characteristic is developed by returning negative feedback from the common output node to the inverting terminal of the control amplifier; or the parallel array of drivers provides inverting gain, and the overall voltage-mode output characteristic is developed by returning negative feedback from the common output node to the non-inverting terminal of the control amplifier; or the parallel array of drivers provides non-inverting gain, and the overall current-mode output characteristic is developed by providing feedback from the proximal end of an output current sensing means to the inverting terminal of the control amplifier and providing feedback from the distal end of said output current sensing means to the non-inverting terminal of the control amplifier; or the parallel array of drivers provides inverting gain, and the overall current-mode output characteristic is developed by providing feedback from the proximal end of an output current sensing means to the non-inverting terminal of the control amplifier and providing feedback from the distal end of said output current sensing means to the inverting terminal of the control amplifier.

11. A parallel array of drivers having a common input node and a common main output node, said array comprising:

a first driver capable of providing an output signal conveyed through a first sensor to a main output node and disposed to receive a controlling signal from a common input node;

at least one additional driver capable of providing an output signal conveyed through a sensor to said main output node and disposed to receive a controlling signal from said common input node; and a differential servo associated with each said drivers and configured to differentially sense the output voltages of said first driver and said additional driver, said differential servo being disposed to convey negative feedback to said additional driver.

12. The apparatus of claim 11 wherein said first driver is a differential operational amplifier having an inverting input and a non-inverting input and an output, and wherein said non-inverting input receives a controlling input signal, and wherein a local negative feedback is applied between said inverting input and said output, said output being coupled to one input of a servo integrator amplifier.

13. The apparatus of claim 11 wherein said first driver is a differential operational amplifier having in inverting input terminal, a non-inverting input terminal and an output terminal wherein its inverting input terminal receives a controlling input signal, and local negative feedback is applied between its inverting input and its output terminal, said output signal being coupled to one input of a servo integrator amplifier.

14. The apparatus of claim 11, wherein each additional driver is a differential operational amplifier in communication with an accompanying servo amplifier in a non-inverting configuration wherein each of said differential operational amplifiers receives a controlling signal at its non-inverting input terminal and local negative feedback is applied between its inverting input terminal and the output terminal, said output being coupled to an inverting input of a servo integrator amplifier, wherein output of said servo amplifier is conveyed as negative feedback to the non-inverting input of said differential operational amplifier, while a non-inverting terminal of said servo amplifier is coupled to said output of said first driver.

15. The apparatus of claim 11 wherein each additional driver is a differential operational amplifier in communication with an accompanying servo amplifier in an inverting configuration wherein each additional driver amplifier receives a controlling signal at its inverting input terminal and local negative feedback is applied between said inverting input and the output of said additional drive amplifier, and said output signal is conveyed to the inverting input of a servo integrator amplifier, the output of said servo amplifier being conveyed as negative feedback to the non-inverting input of said additional driver amplifier, while the non-inverting terminal of said servo amplifier is coupled to the output of said first driver.

16. The apparatus of claim 11 wherein each additional driver is a differential operational amplifier in communication with an accompanying servo amplifier in an inverting configuration wherein each additional driver amplifier receives a controlling signal at its inverting input terminal and local negative feedback is applied between said inverting input and the output of said additional drive amplifier, and said output signal is conveyed to the non-inverting input of a servo integrator amplifier, the output of said servo amplifier being conveyed as negative feedback to the inverting input of said additional driver amplifier, while the inverting terminal of said servo amplifier is coupled to the output of said first driver.

17. The apparatus of claim 15 wherein gain of each additional driver amplifier is increased by interposing a non-zero impedance element between its inverting input and a separate fixed potential node.

18. The apparatus of claim 11, wherein said differential servo exhibits significant gain over a very wide bandwidth.

19. The apparatus of claim 11 wherein said differential servo exhibits significant gain only over a limited bandwidth that includes DC wherein said bandwidth is limited by providing capacitors and resistors to configure the amplifier as a differential integrator.

20. The apparatus of claim 11 wherein said differential servo exhibits significant gain only over a limited bandwidth that includes DC wherein said bandwidth is limited by intrinsic limitations of said servo.

21. A composite amplifier comprising:

a control amplifier having differential inputs, disposed to deliver a controlling input signal for a parallel array of substantially identical drivers, wherein one of said drivers is a master driver and each other of said drivers is a slave driver of said master driver;

wherein for each slave driver, an associated differential servo amplifier is operative to force the output voltage of its associated slave driver to substantially track the output voltage of the master driver.

* * * * *